United States Patent
Woo et al.

(10) Patent No.: US 7,414,505 B2
(45) Date of Patent: Aug. 19, 2008

(54) HIGH FREQUENCY INDUCTOR HAVING LOW INDUCTANCE AND LOW INDUCTANCE VARIATION AND METHOD OF MANUFACTURING THE SAME

(75) Inventors: Sang-hyun Woo, Seoul (KR); Kwang-du Lee, Seoul (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 175 days.

(21) Appl. No.: 10/436,142

(22) Filed: May 13, 2003

(65) Prior Publication Data

US 2004/0227610 A1   Nov. 18, 2004

(51) Int. Cl.
- H01F 5/00 (2006.01)
- H01F 7/06 (2006.01)
- H01L 23/02 (2006.01)

(52) U.S. Cl. ............... 336/200; 336/223; 336/232; 257/686; 29/602.1

(58) Field of Classification Search .......... 336/200, 336/223, 232; 357/688, 690; 257/701, 690, 257/691, 686, 678; 29/601.2, 605–606, 602.1
See application file for complete search history.

(56) References Cited

U.S. PATENT DOCUMENTS

| | | | |
|---|---|---|---|
| 5,440,805 A | 8/1995 | Daigle et al. | 29/830 |
| 5,474,458 A * | 12/1995 | Vafi et al. | 439/91 |
| 5,869,894 A * | 2/1999 | Degani et al. | 257/723 |
| 6,075,710 A | 6/2000 | Lau | 361/760 |
| 6,130,483 A * | 10/2000 | Shizuki et al. | 257/778 |
| 6,180,445 B1 * | 1/2001 | Tsai | 438/238 |
| 6,236,109 B1 * | 5/2001 | Hsuan et al. | 257/688 |
| 6,239,366 B1 * | 5/2001 | Hsuan et al. | 174/52.3 |
| 6,259,037 B1 * | 7/2001 | Feilchenfeld et al. | 174/260 |
| 6,307,160 B1 | 10/2001 | Mei et al. | |
| 6,320,257 B1 * | 11/2001 | Jayaraj et al. | 257/723 |
| 6,356,453 B1 * | 3/2002 | Juskey et al. | 361/760 |
| 6,365,499 B1 | 4/2002 | Nakamura et al. | |
| 6,400,172 B1 | 6/2002 | Akram et al. | |
| 6,515,369 B1 * | 2/2003 | Lin | 257/773 |
| 6,534,855 B1 * | 3/2003 | Ahn et al. | 257/698 |
| 6,545,338 B1 * | 4/2003 | Bothra et al. | 257/508 |
| 6,784,530 B2 * | 8/2004 | Sugaya et al. | 257/686 |
| 6,838,763 B2 * | 1/2005 | Ahn et al. | 257/698 |
| 2001/0054938 A1 | 12/2001 | Miller | 333/33 |
| 2002/0011662 A1 | 1/2002 | Komiya et al. | 257/728 |
| 2002/0074637 A1 * | 6/2002 | McFarland | 257/686 |
| 2002/0172025 A1 | 11/2002 | Megahed | 361/767 |
| 2003/0198032 A1 | 10/2003 | Collander et al. | 361/760 |
| 2007/0010065 A1 * | 1/2007 | Das et al. | 438/393 |

FOREIGN PATENT DOCUMENTS

| EP | 1104026 | 5/2001 |
|---|---|---|
| JP | 20003340609 | 8/2000 |

OTHER PUBLICATIONS

Microelectronics Packaging Handbook, Tummaia & Rymaszewski, Editors, pp. 128-129 (1988).

* cited by examiner

Primary Examiner—Anh T Mai
(74) Attorney, Agent, or Firm—Lee & Morse, P.C.

(57) ABSTRACT

An inductor used in an RF unit for a wireless communication terminal, includes first inductor means for electrically connecting an RF chip placed over a substrate at a predetermined distance from the substrate that are enclosed by an interlayer dielectric layer and second inductor means for connecting the RF chip to the first inductor means.

31 Claims, 8 Drawing Sheets

HIGH FREQUENCY INDUCTOR HAVING LOW INDUCTANCE AND LOW INDUCTANCE VARIATION AND METHOD OF MANUFACTURING THE SAME

BACKGROUND OF THE INVENTION

1. Field of the Invention

The present invention relates to an inductor used in a radio frequency (RF) unit for a wireless communication terminal. More particularly, the present invention relates to an inductor having a low inductance value and a low inductance variation.

2. Description of the Related Art

Wireless communication terminals in the current marketplace are compact, light, consume a small amount of power, and have a low unit cost. Nevertheless, a further reduction in size, power consumption, and fabrication costs are primary considerations in manufacturing high-quality wireless communication terminals.

For this purpose, an RF port of a wireless communication terminal has to be made into one chip. Due to this requirement, it is critical to reduce the size of electronic devices constituting the RF port, in particular, the size of an inductor contained in a chip. In addition, maintaining the stability, as well as a high Q-factor, of an inductor is also important.

An inductor used in the RF port is mainly a spiral inductor or a bondwire inductor. As shown in FIG. 1, a conventional spiral inductor is formed by winding a metal wire several times on a plane. FIG. 1 includes an input port 10, an output port 12, and a mutual capacitance 16.

FIG. 2 is an equivalent circuit diagram of the conventional spiral inductor shown in FIG. 1. Referring to FIG. 2, a metal wire 18 is formed between the input port 10 and the output port 12 of the conventional inductor. A first parasitic capacitor 22 is positioned on the metal wire 18. Second parasitic capacitors 24 are interposed between the metal wire 18 and a substrate 20.

A self-resonant frequency (SRF) and a Q-factor of the conventional inductor decrease due to the first and second parasitic capacitors 22 and 24. In particular, if the substrate 20 is a silicon substrate, a signal input via the input port 10 leaks to the substrate 20, which increases the substrate loss.

A bondwire inductor is formed of a wire used in packaging bare chips (not shown) on the substrate, and has a high Q-factor and a low inductance. However, since a bondwire inductor occupies a large area when packaging the bare chips, the entire area of an RF chip increases. In addition, since the shape and length of the wire may gradually vary when processes of forming the bondwire inductor are performed, the inductance of the bondwire inductor may gradually vary.

In a case where an inductor having a low inductance is used, the effect of inductance variation may be large although the actual inductance variation is small. A low noise amplifier (LNA) of the wireless communication terminal exemplifies this situation. More particularly, the input impedance of the LNA in the wireless communication terminal depends on a source inductor of a first transistor and has to be reduced with an increase in a frequency. For example, a source inductor used in an LNA having a wireless LAN USII band of 5.725-5.825 GHz is primarily a bondwire inductor, a value of which is about 0.5 nH. In this case, the inductance of the source inductor may have an error of about 0.1 nH, which may be caused by a process variation. This error of about 0.1 nH, however, error degrades input reflection to 10 dB or more. This is a significant obstacle in designing LNA.

SUMMARY OF THE INVENTION

The present invention provides an inductor in an RF unit for a wireless terminal that is capable of preventing a reduction in a Q-factor due to a substrate loss and a reduction in an SRF due to parasitic capacitors so as to lower an inductance and minimize a variation in the inductance and can reduce the area of the RF chip. The present invention also provides a method of manufacturing the inductor.

According to an aspect of the present invention, there is provided an inductor used in an RF unit for a wireless communication terminal, including first inductor means for electrically connecting an RF chip placed over a substrate at a predetermined distance from the substrate that are enclosed by an interlayer dielectric layer and second inductor means for connecting the RF chip to the first inductor means.

The substrate may be selected from a printed circuit board (PCB), a ceramic substrate, a glass substrate, a silicon substrate, and a substrate on which chips can be packaged. The interlayer dielectric layer preferably has a low dielectric constant, conductivity, and loss tangent.

Preferably, the first inductor means are conductive plugs having lower portions connected to the substrate and upper portions connected to the second inductor means.

Preferably, the second inductor means are upper flip-chip bumps contacting the upper portions of the conductive plugs and the RF chip.

According to an embodiment of the present invention, the inductor may further include a lower conductive adhesive film, which encloses the conductive plugs, between the interlayer dielectric layer and the substrate.

According to another embodiment of the present invention, the inductor may further third inductor means for connecting the lower portions of the conductive plugs to the substrate. Preferably, the third inductor means are lower flip-chip bumps connecting the lower portions of the conductive plugs and the substrate. Further, the inductor may include a lower conductive adhesive film between the third inductor means and the substrate.

According to another embodiment of the present invention, the inductor may further include an upper conductive adhesive film between the interlayer dielectric layer and the upper flip-chip bumps.

Preferably, the upper and lower conductive adhesive films have an electric resistance reduced in a direction toward which pressure is applied and is selected from the group consisting of an anisotropic conductive adhesive film, an isotropic conductive adhesive film, and a non-conductive adhesive film.

According to another embodiment of the present invention, the inductor may include an upper conductive adhesive film between the upper flip-chip bumps and the upper portions of the conductive plugs. Alternately, the inductor may include an upper conductive adhesive film between the upper portions of the conductive plugs and the upper flip-chip bumps.

According to another aspect of the present invention, there is provided a method of manufacturing an inductor including forming an interlayer dielectric layer on a substrate; forming first inductor means through the interlayer dielectric layer to connect to the substrate; and forming an RF chip having second inductor means over the interlayer dielectric film a predetermined distance from the interlayer dielectric layer, the first and second inductor means electrically connecting the substrate to pad areas of the RF chip.

Preferably, forming the first inductor means includes forming contact holes in the interlayer dielectric layer to expose the substrate; and filling the contact holes with conductive plugs that are the first inductor means.

Forming the RF chip may include forming upper flip-chip bumps beneath the pad areas of the RF chip; arranging the RF chip so that the upper flip-chip bumps correspond on a one-to-one basis to the conductive plugs; and pressing the substrate and the RF chip at a predetermined temperature and with a predetermined pressure to bond the RF chip to the substrate.

A distance between the contact holes and a diameter of the contact holes may be determined by a distance between the pad areas of the RF chip and the size of the upper bump members.

Forming the RF chip may include forming upper bumps contacting the conductive plugs on the interlayer dielectric layer; arranging the RF chip so that the pad areas of the RF chip correspond on a one-to-one basis to the upper bumps; and pressing the substrate and the RF chip at a predetermined temperature and with a predetermined pressure to bond the RF chip to the substrate.

Alternately, before the interlayer dielectric layer is formed, a lower conductive adhesive film may be formed.

Before the substrate and the RF chip are bonded, an upper conductive adhesive film covering the exposed surfaces of the conductive plugs may be formed on the interlayer dielectric layer.

According to another embodiment of the present invention, a method of manufacturing an inductor includes forming an interlayer dielectric layer including first inductor means formed in the interlayer dielectric layer; placing the interlayer dielectric layer over a substrate at a predetermined distance from the substrate; forming third inductor means connecting the first inductor means to the substrate; and placing an RF chip over the interlayer dielectric layer at a predetermined distance, the RF chip including second inductor means connecting the first inductor means to pad areas of the RF chip.

Forming the interlayer dielectric layer may include forming the interlayer dielectric layer on a substrate; forming contact holes in the interlayer dielectric layer to expose the substrate; filling the contact holes with conductive plugs that are the first inductor means; and separating the interlayer dielectric layer from the substrate.

Preferably, the second and third inductor means are upper and lower flip-chip bumps, respectively.

Placing the interlayer dielectric layer over the substrate may include forming the upper flip-chip bumps on the substrate in consideration of a distance between the pad areas of the RF chip and the area of the pad areas; arranging the interlayer dielectric layer so that the conductive plugs correspond on a one-to-one basis to the upper flip-chip bumps; and pressing the substrate and the interlayer dielectric layer at a predetermined temperature and with a predetermined pressure to flip-chip bond the interlayer dielectric layer to the substrate.

Alternately, placing the interlayer dielectric layer over the substrate may include forming lower flip-chip bumps contacting the conductive plugs on a side of the interlayer dielectric layer; and pressing the substrate and the interlayer dielectric layer at a predetermined temperature and with a predetermined pressure to bond the interlayer dielectric layer to the substrate.

Placing the RF chip over the interlayer dielectric layer may include forming the upper flip-chip bumps beneath the pad areas of the RF chip; arranging the RF chip so that the upper flip-chip bumps correspond on a one-to-one basis to the conductive plugs; and pressing the substrate and the interlayer dielectric layer at a predetermined temperature and with a predetermined pressure to bond the interlayer dielectric layer to the substrate.

Alternately, placing the RF chip over the interlayer dielectric layer may include forming the upper flip-chip bumps beneath the pad areas of the RF chip; arranging the RF chip so that the upper flip-chip bumps correspond on a one-to-one basis to the conductive plugs; and pressing the substrate and the interlayer dielectric layer at a predetermined temperature and with a predetermined pressure to bond the interlayer dielectric layer to the substrate.

Before the interlayer dielectric layer is flip-chip bonded to the substrate, a lower conductive adhesive film is formed on the substrate.

Before the interlayer dielectric layer is flip-chip bonded to the RF chip, an upper conductive adhesive film covering the exposed surfaces of the conductive plugs may be formed on the interlayer dielectric layer.

Alternately, before the interlayer dielectric layer is flip-chip bonded to the RF chip, an upper conductive adhesive film covering the exposed surfaces of the conductive plugs may be formed on the interlayer dielectric layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
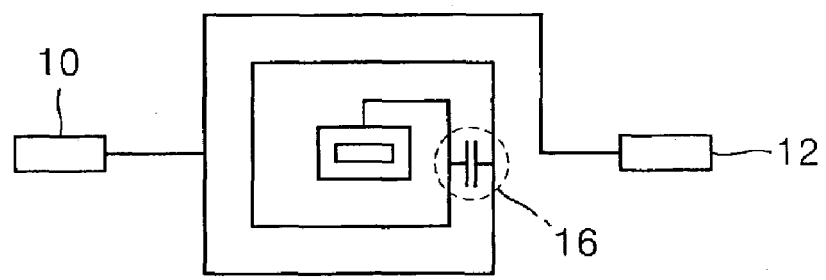
FIG. 1 illustrates a plan view of a conventional spiral inductor according to the prior art.
Figure 2:
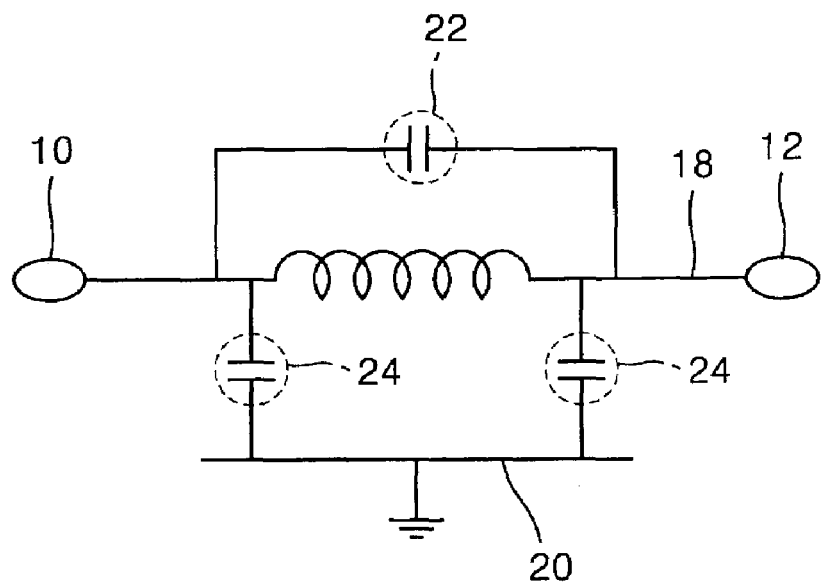
FIG. 2 is a cross-sectional equivalent circuit diagram of the conventional inductor shown in FIG. 1.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Hereinafter, inductors used in an RF unit for a wireless communication terminal and a manufacturing method thereof according to the several embodiments of the present invention will be described in detail with reference to the attached drawings.

The inductors used in the RF unit for the wireless communication terminal will now be described.

Figure 3:
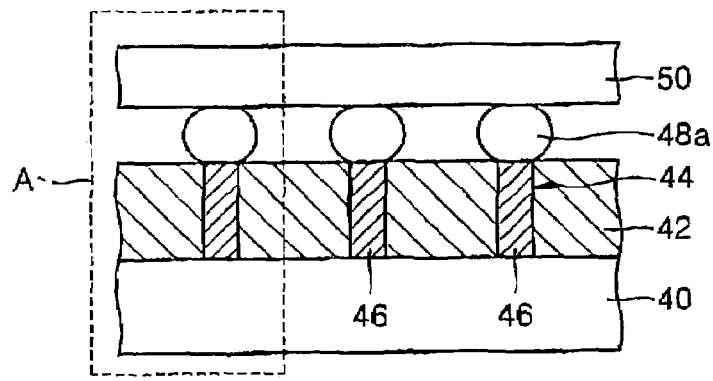
FIG. 3 illustrates a cross-sectional view of inductors used in an RF unit for a wireless communication terminal according to a first embodiment of the present invention.

Referring to FIG. 3, an interlayer dielectric layer 42 having a predetermined thickness is formed on a substrate 40. The substrate 40 may be a printed circuit board (PCB), a ceramic substrate, a glass substrate, a silicon substrate, or the like. Alternatively, the substrate 40 may be a substrate on which chips can be packaged. It is preferable that the interlayer dielectric layer 42 has a low dielectric constant, conductivity, and loss tangent. Contact holes 44, which expose the substrate 40, are formed in the interlayer dielectric layer 42. The contact holes 44 are filled with conductive plugs 46. The conductive plugs 46 are used as first inductor means. Upper flip-chip bumps 48a, which cover the entire exposed upper surfaces of the conductive plugs 44, are formed on the interlayer dielectric layer 42. The upper flip-chip bumps 48a are used as second inductor means. An RF chip 50 having active and passive devices is placed at a predetermined distance from the surface of the interlayer dielectric layer 42. The RF chip 50 is supported by the upper flip-chip bumps 48a contacting pads (not shown) thereof. The upper flip-chip bumps 48a serve to connect the conductive plugs 46 to the pads of the RF chip 50 while being positioned between the interlayer dielectric layer 42 and the RF chip 50.

The conductive plugs 46 and the upper flip-chip bumps 48a include inductive, resistive, and capacitive components. This structure will be described in greater detail with reference to FIG. 4, which illustrates a portion A of FIG. 3 including the conductive plugs 46 and the upper flip-chip bumps 48a and an equivalent circuit.

Figure 4:
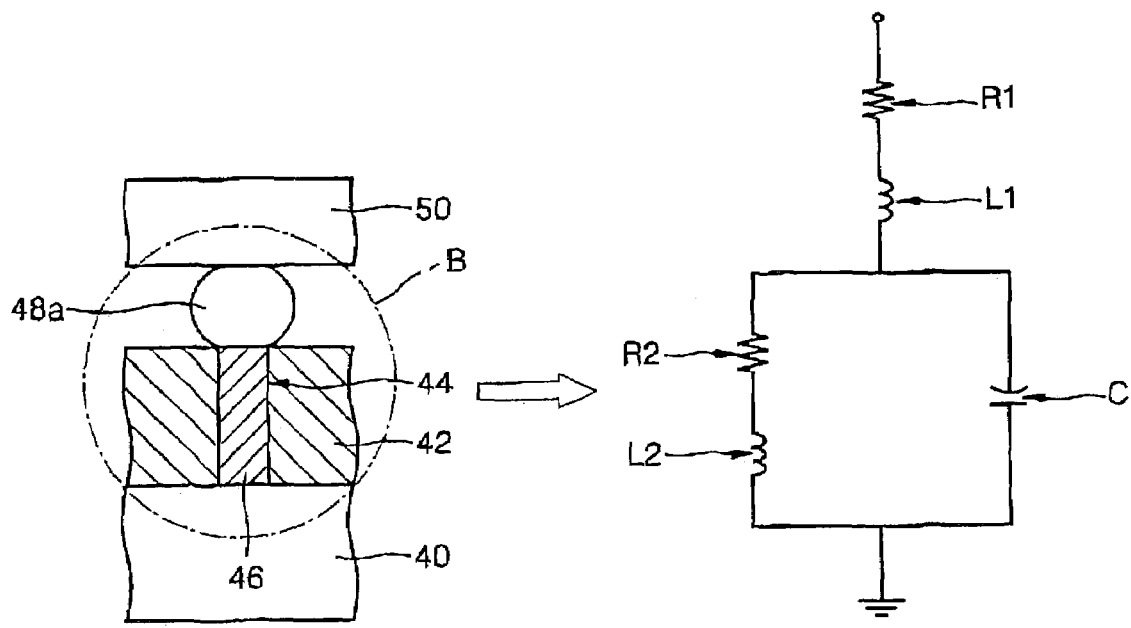
FIG. 4 illustrates portion A of the structure shown in FIG. 3 and an equivalent circuit thereof.

In the equivalent circuit shown in FIG. 4, which is equivalent to the area indicated by reference character B, a first resistor R1 and a first inductor L1 are provided by the upper flip-chip bumps 48a. A second resistor R2 and a second inductor L2, which are connected to a capacitor C in parallel, are provided by the conductive plugs 46 filling the contact holes 44. The capacitor C is composed of the conductive plugs 46, the substrate 40, and the interlayer dielectric layer 42.

Figure 5:
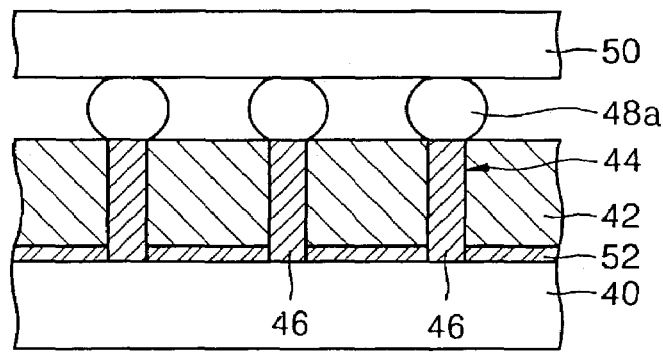
FIGS. 5 through 8 illustrate cross-sectional views of inductors used in an RF unit for a wireless communication terminal according to the various embodiments of the present invention.

FIG. 5 illustrates a cross-sectional view of inductors used in an RF unit for a wireless communication terminal according to a second embodiment of the present invention. Referring to FIG. 5, a lower conductive adhesive film 52 and an interlayer dielectric layer 42 are sequentially formed on a substrate 40. The lower conductive adhesive film 52 is formed to adhere securely the interlayer dielectric layer 42 onto the substrate 40. Contact holes 44, which expose predetermined areas of the substrate 40, are formed in the lower conductive adhesive film 52 and the interlayer dielectric layer 42. The contact holes 44 are filled with conductive plugs 46. The entire exposed upper surfaces of the conductive plugs 46 contact the upper flip-chip bumps 48a on the interlayer dielectric layer 42. Upper surfaces of the upper flip-chip bumps 48a contact pad areas (not shown) of an RF chip 50. Due to the upper flip-chip bumps 48a, the interlayer dielectric layer 42 is separated from the RF chip 50 by a distance corresponding to the height of the upper flip-chip bumps 48a.

Figure 6:
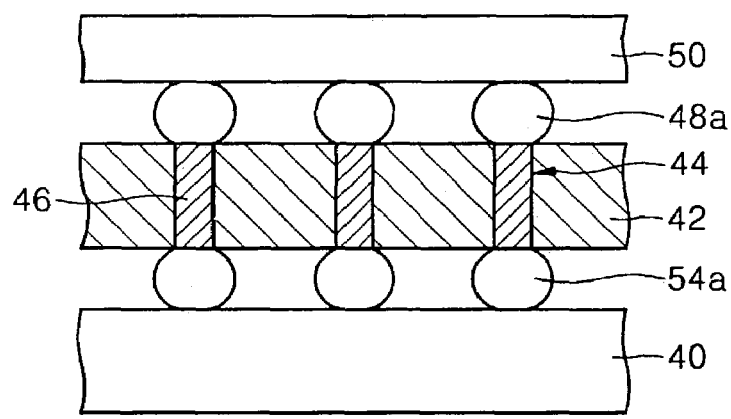

FIG. 6 illustrates a cross-sectional view of inductors used in an RF unit for a wireless communication terminal according to a third embodiment of the present invention.

The third embodiment is characterized by the formation of lower flip-chip bumps on and beneath an interlayer dielectric layer 42. In detail, referring to FIG. 6, lower flip-chip bumps 54a are formed on a substrate 40. The lower flip-chip bumps 54a serve as supports so that the interlayer dielectric layer 42 is formed over the substrate 40. Contact holes 44, which expose the lower flip-chip bumps 54a, are formed in the interlayer dielectric layer 42. The contact holes 44 are filled with conductive plugs 46. Upper flip-chip bumps 48a, which contact the entire exposed upper surfaces of the conductive plugs 46, are formed on the interlayer dielectric layer 42. The upper flip-chip bumps 48a serve as supports so that an RF chip 50 is placed over the interlayer dielectric layer 42. In the third embodiment, the lower flip-chip bumps 54a are used as a third inductor means.

Figure 7:
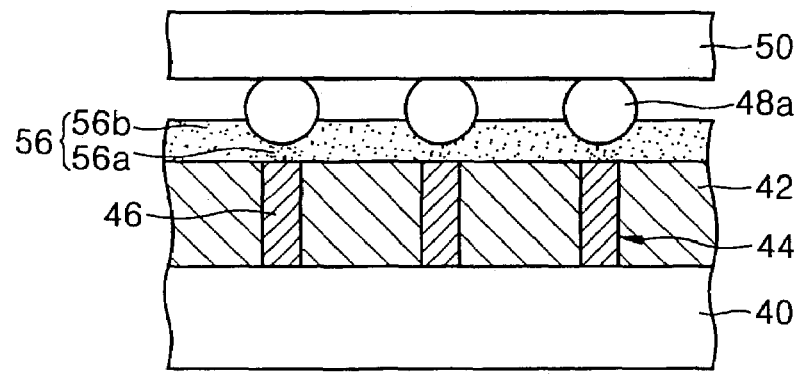

FIG. 7 illustrates a cross-sectional view of inductors used in an RF unit for a wireless communication terminal according to a fourth embodiment of the present invention. Referring to FIG. 7, an upper conductive adhesive film 56, which covers the entire exposed surfaces of conductive plugs 46 and the entire surface of an interlayer dielectric layer 42, is formed between the interlayer dielectric layer 42 and the upper flip-chip bumps 48a. Here, it is preferable that the upper conductive adhesive film 56 is an anisotropic conductive adhesive film, an isotropic conductive adhesive film, or a non-conductive adhesive film, an electric resistance of which is reduced in a direction toward which pressure is applied. Specifically, since portions 56a of the upper conductive adhesive film 56 pressed by the upper flip-chip bumps 48a have a lower electric resistance than the remaining portions 56b of the upper conductive adhesive film 56, an electric signal is transmitted from the upper flip-chip bumps 48a only to the conductive plugs 46.

Figure 8:
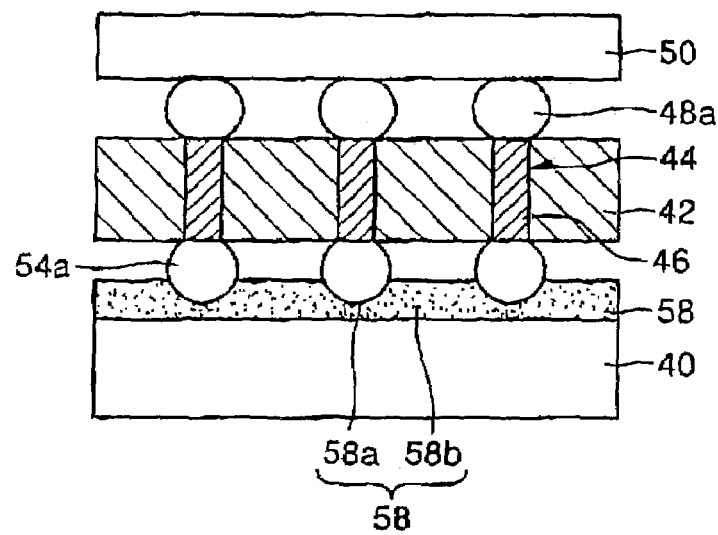

FIG. 8 illustrates a cross-sectional view of inductors used in an RF unit for a wireless communication terminal according to a fifth embodiment of the present invention.

As shown in FIG. 8, the fifth embodiment is similar to the third embodiment but varies in that a lower conductive adhesive film 58 is formed between a substrate 40 and lower flip-chip bumps 54a. It is preferable that the lower conductive adhesive film 58 is the same as the upper conductive adhesive film 56 described in the fourth embodiment. More particularly, since portions 58a of the lower conductive adhesive film 58 pressed by the lower flip-chip bumps 54a have a lower electric resistance than the remaining portions 58b of the upper conductive adhesive film 58, an electric signal is transmitted from the lower flip-chip bumps 54a only to the conductive plugs 46.

A method of manufacturing inductors used in an RF unit for a wireless communication terminal will now be described according to the first, second and third embodiments of the present invention.

FIGS. 9 through 13 illustrate cross-sectional views for explaining stages in a method of manufacturing inductors used in an RF unit for a wireless communication terminal according to the first embodiment of the present invention.

Figure 9:
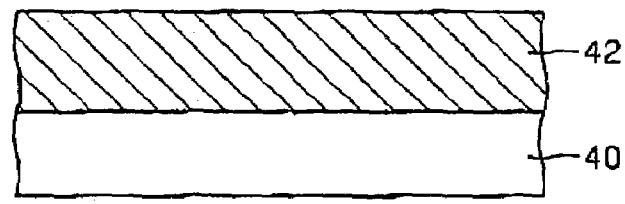
FIGS. 9 through 13 illustrate cross-sectional views for explaining stages in a method of manufacturing the inductors according to a first embodiment of the present invention.

Referring now to FIG. 9, an interlayer dielectric layer 42 is formed on a substrate 40. The substrate 40 may be a PCB, a ceramic substrate, a glass substrate, a silicon substrate, or the like. The substrate 40 may also be a substrate on which chips can be packaged. It is preferable that the interlayer dielectric layer 42 is formed of a dielectric layer having low dielectric loss.

Figure 10:
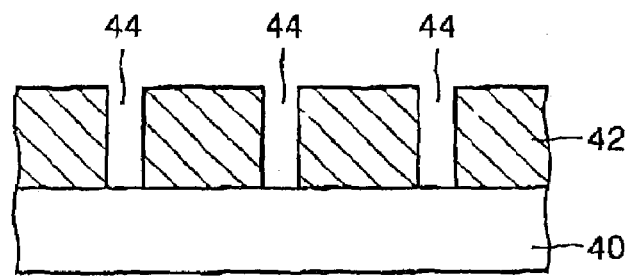
Figure 11:
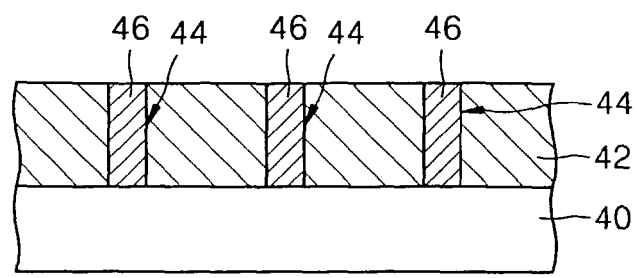

Next, as may be seen in FIG. 10, contact holes 44, which expose the substrate 40, are formed in the interlayer dielectric layer 42. As shown in FIG. 11, the contact holes 44 are filled with conductive plugs 46. Here, the surface of the resultant structure is planarized. The conductive plugs 46 are used as first inductor means.

Figure 12:
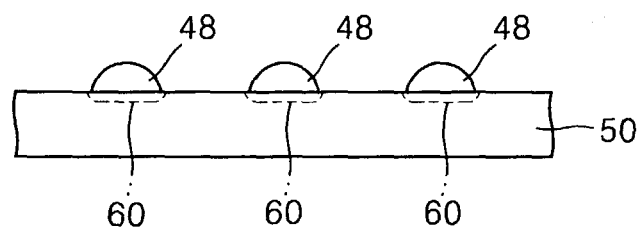
Figure 13:
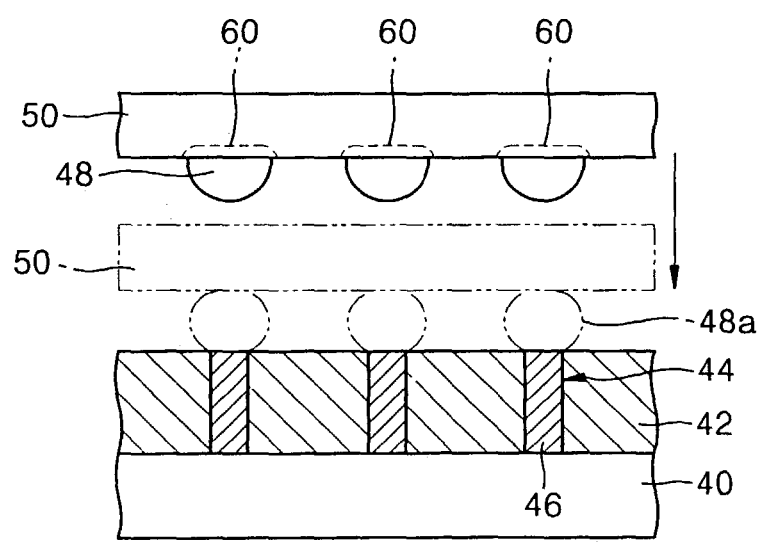

Referring now to FIG. 12, upper bump members 48 for flip-chip bonding are formed on pad areas 60 of an RF chip 50 including a transmitter and a receiver respectively composed of active and passive devices. As shown in FIG. 13, the RF chip 50 is inverted, and then is arranged so that the upper bump members 48 correspond on a one-to-one basis to the conductive plugs 46. Thereafter, the RF chip 50 is flip-chip bonded to the substrate 40. As a result, first inductors according to the first embodiment are completed. In this process, the upper bump members 48 are melted at a predetermined temperature and pressured at a predetermined pressure to form upper flip-chip bumps 48a between the pad areas 60 of the RF chip 50 and the conductive plugs 46. The upper flip-chip bumps 48a are used as second inductor means. Accordingly, inductors are formed having a low inductance necessary for input and output ports (not shown) of the RF chip 50.

As described above, since the upper bump members 48 correspond on a one-to-one basis to the conductive plugs 46, it is preferable that a distance between the contact holes 44 and a diameter of the contact holes 44 are determined in consideration of a distance between the pad areas 60 of the RF chip 50 and the size of the upper bump members 48.

Alternatively, the upper bump members 48 may be formed on the interlayer dielectric layer 42 to contact the conductive plugs 46, the RF chip 50 may be arranged so that the pad areas 60 of the RF chip 50 correspond on a one-to-one basis to the upper bump members 48, and the RF chip 50 and the substrate 40 may be pressed at a predetermined temperature and with a predetermined pressure so that the RF chip 50 is bonded to the substrate 40.

FIGS. 14 through 17 illustrate cross-sectional views for explaining stages in a method of manufacturing inductors used in a RF unit for a wireless communication terminal according to the second embodiment of the present invention.

Figure 14:
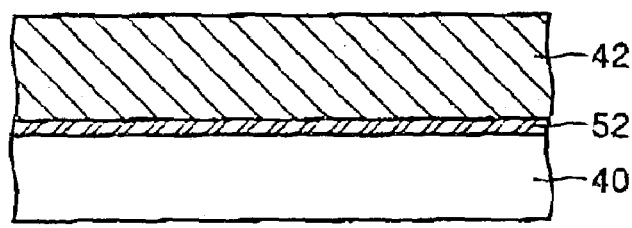
FIGS. 14 through 17 illustrate cross-sectional views for explaining stages in a method of manufacturing the inductors according to a second embodiment of the present invention.
Figure 15:
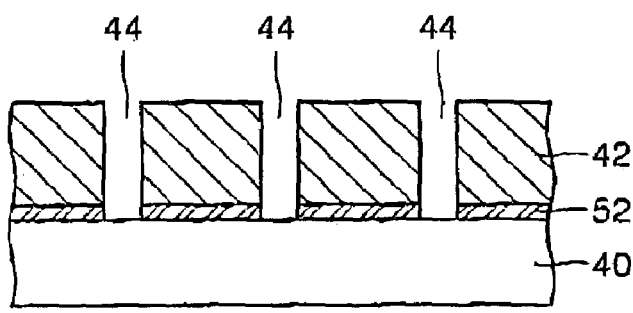
Figure 16:
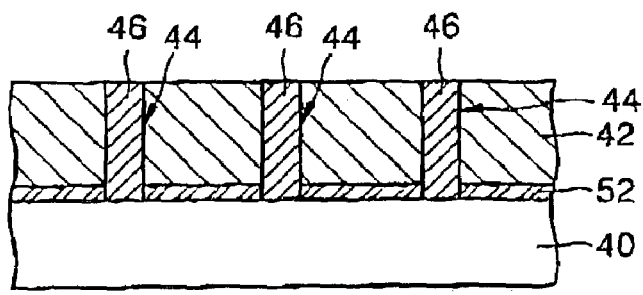
Figure 17:
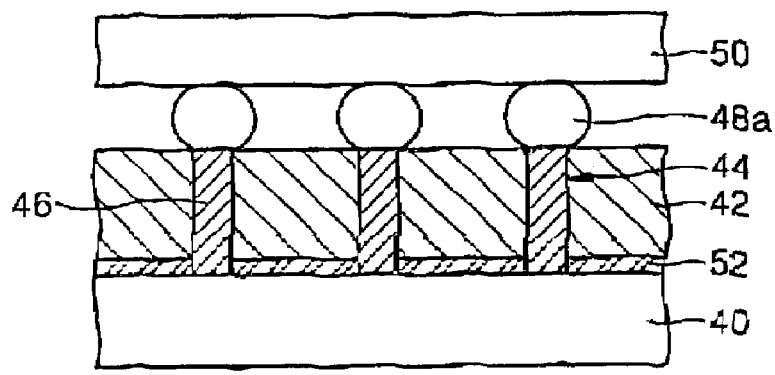

Referring to FIG. 14, a lower conductive adhesive film 52 and an interlayer dielectric layer 42 are sequentially formed on a substrate 40. The lower conductive adhesive film 52 serves to adhere securely the interlayer dielectric layer 42 onto the substrate 40 and may be electrically connected to a wire (not shown) of the substrate 40. As shown in FIG. 15, contact holes 44, which expose the substrate 40, are formed in the lower conductive adhesive film 52 and the interlayer dielectric layer 42. Next, as shown in FIG. 16, the contact holes 44 are filled with conductive plugs 46, and then the resultant structure is planarized. Thereafter, steps that are to be described with reference to FIG. 17 are the same as those described in connection with the first embodiment, and inductors according to the second embodiment, as shown in FIG. 5, are completed.

Figure 18:
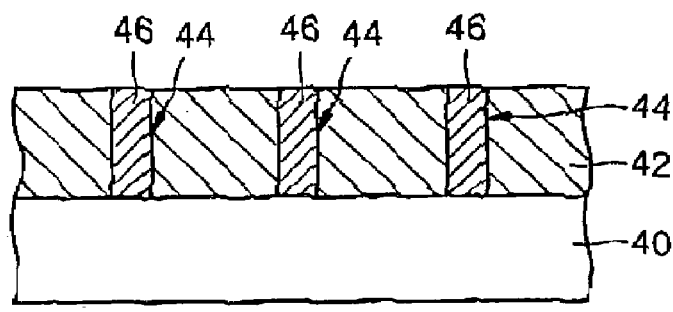
FIGS. 18 through 22 illustrate cross-sectional views for explaining stages in a method of manufacturing the inductors according to a third embodiment of the present invention.
Figure 19:
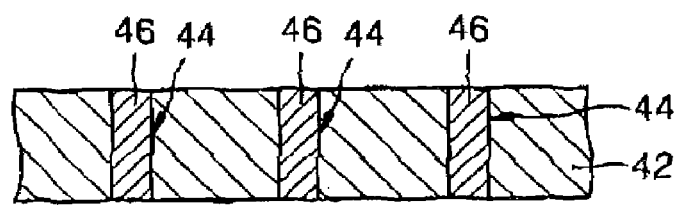
Figure 20:
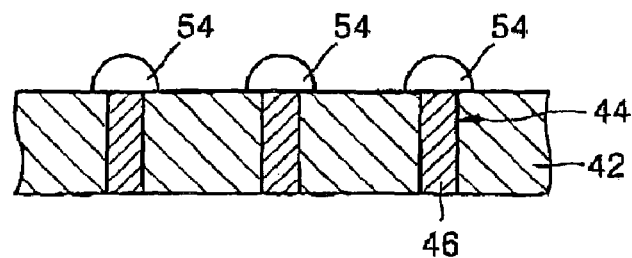
Figure 21:
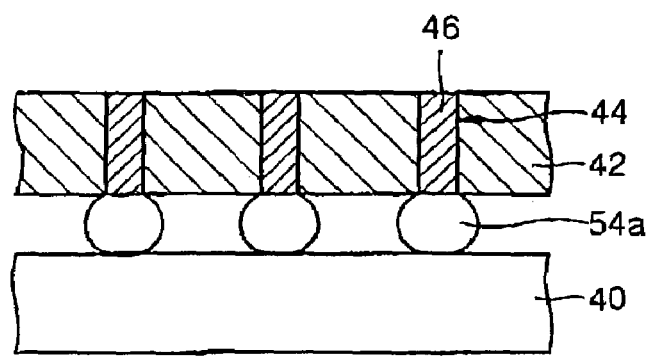
Figure 22:
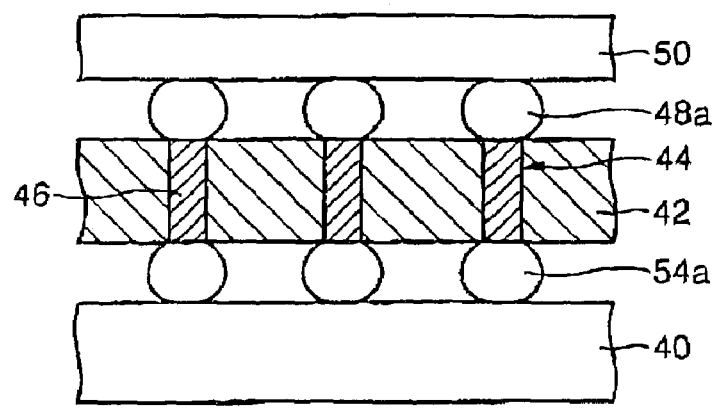

FIGS. 18 through 22 illustrate cross-sectional views for explaining stages in a method of manufacturing the inductors used in an RF unit for a wireless communication terminal according to the third embodiment of the present invention. Referring to FIG. 18, an interlayer dielectric layer 42 is formed on a substrate 40. Contact holes 44, which expose the substrate 40, are formed in the interlayer dielectric layer 42. The contact holes 44 are filled with conductive plugs 46, and then the resultant structure is planarized. Thereafter, as shown in FIG. 19, the interlayer dielectric layer 42 including the contact holes 44 filled with the conductive plugs 46 is separated from the substrate 40. As shown in FIG. 20, lower bump members 54, which contact the conductive plugs 46, preferably cover the entire exposed surfaces of the conductive plugs 46, are formed on a side of the interlayer dielectric layer 42. Next, as shown in FIG. 21, the side of the interlayer dielectric layer 42 on which the lower bump members 54 are formed is inverted so that it faces the substrate 40, and then the interlayer dielectric 42 is bonded to the substrate 40 using the lower bump members 54. In this process, the lower bump members 54 are supplied with a predetermined temperature and pressure, and thus lower flip-chip bumps 54a are formed to connect the interlayer dielectric layer 42 to the substrate 40. The flip-chip bonding of an RF chip 50 to the interlayer dielectric 42 that is flip-chip bonded to the substrate 40 is the same as that described with reference to FIGS. 9 through 13, and inductors according to the third embodiment, as shown in FIG. 6, are thus formed. The completed inductors are composed of upper and lower flip-chip bumps 48a and 54a, respectively, and the conductive plugs 46.

The fourth embodiment, described with reference to FIG. 7, is characterized by additionally forming the upper conductive adhesive film 56 between the interlayer dielectric 42 including the conductive plugs 46 and the upper flip-chip bumps 48a according to the first embodiment as described with reference to FIGS. 9 through 13.

The fifth embodiment, described with reference to FIG. 8, is characterized by additionally forming the lower conductive adhesive film 58 between the substrate 40 and the lower flip-chip bumps 54a according to the third embodiment as described with reference to FIGS. 18 through 22.

The fifth embodiment, as described with reference to FIG. 8, may further include forming a conductive adhesive film on the entire surface of the interlayer dielectric layer 42 and the entire exposed surfaces of the conductive plugs 46, and adhering the RF chip 50 onto the upper conductive adhesive film via the upper flip-chip bumps 48a.

In the method described with reference to FIGS. 14 through 17, an upper conductive adhesive film may be formed on the entire surface of the interlayer dielectric film 42 and the entire exposed surfaces of the conductive plugs 46, and then the RF chip 50 may be bonded to the upper conductive adhesive film via the upper flip-chip bumps 48a.

As described above, since conductive plugs belonging to components constituting inductors are enclosed by a dielectric layer having low dielectric constant, conductivity, and loss tangent, substrate loss can be minimized, which results in a high Q-factor of the inductors. In addition, since the capacitance of parasitic capacitors is very small, a high SRF may be obtained. Further, since short conductive plugs, as well as flip-chip bumps, can be highly re-formed using a semiconductor manufacturing process, inductors having a low inductance and a low inductance variation can be manufactured. Furthermore, since flip-chip bonding is used, the size of a chip can be reduced to 30% or less of the size of a chip using wire bonding.

The present invention has been particularly shown and described with reference to exemplary embodiments thereof. However, the embodiments of the present invention may be modified into various other forms, and the scope of the present invention is not to be interpreted as being restricted to the embodiments. For example, it will be understood by those of ordinary skill in the art that a new process of forming flip-chip bumps can be developed and applied to a method of manufacturing inductors according to the embodiments of the present invention, the interlayer dielectric layer 42 can be a plurality of interlayer dielectric layers having as low a dielectric constant as possible, and the conduct holes 44 can be modified into various alternate forms. For example, instead of contact holes having a uniform diameter as described according to the embodiments of the present invention, stepped contact holes having partially or sequentially different diameters can be formed and filled with conductive plugs that are inductor elements. Accordingly, it will be understood by those of ordinary skill in the art that various changes in form and details may be made without departing from the spirit and scope of the present invention as set forth in the following claims.

What is claimed is:

1. An inductor used in an RF unit for a wireless communication terminal, comprising:
    a first inductor device for electrically connecting an RF chip placed a predetermined distance from the substrate that are enclosed by an interlayer dielectric layer, the interlayer dielectric layer being on a substrate; and
    a second inductor device for connecting the RF chip to the first inductor device,
    wherein the second inductor device covers entire exposed upper surfaces of the first inductor device penetrating the interlayer dielectric layer, and each first inductor device corresponds on a one-on-one basis to a respective one of the second inductor device.

2. The inductor as claimed in claim 1, wherein the substrate is selected from the group consisting of a printed circuit board (PCB), a ceramic substrate, a glass substrate, a silicon substrate, and a substrate on which chips can be packaged.

3. The inductor as claimed in claim 1, wherein the interlayer dielectric layer has a low dielectric constant, conductivity, and loss tangent.

4. The inductor as claimed in claim 1, wherein the first inductor device are conductive plugs having lower portions connected to the substrate and upper portions connected to the second inductor device.

5. The inductor as claimed in claim 4, wherein the second inductor device are upper flip-chip bumps contacting the upper portions of the conductive plugs and the RF chip.

6. The inductor as claimed in claim 5, further comprising a lower conductive adhesive film, which encloses the conductive plugs, between the interlayer dielectric layer and the substrate.

7. The inductor as claimed in claim 5, further comprising third inductor device for connecting the lower portions of the conductive plugs to the substrate.

8. The inductor as claimed in claim 7, wherein the third inductor device are lower flip-chip bumps connecting the lower portions of the conductive plugs and the substrate.

9. The inductor as claimed in claim 7, further comprising a lower conductive adhesive film between the third inductor means and the substrate.

10. The inductor as claimed in claim 9, wherein the lower conductive adhesive film has an electric resistance reduced in a direction toward which pressure is applied and is selected from the group consisting of an anisotropic conductive adhesive film, an isotropic conductive adhesive film, and a nonconductive adhesive film.

11. The inductor as claimed in claim 9, further comprising an upper conductive adhesive film between the upper flip-chip bumps and the upper portions of the conductive plugs.

12. The inductor as claimed in claim 5, further comprising an upper conductive adhesive film between the interlayer dielectric layer and the upper flip-chip bumps.

13. The inductor as claimed in claim 12, wherein the upper conductive adhesive film has an electric resistance reduced in a direction toward which pressure is applied and is selected from the group consisting of an anisotropic conductive adhesive film, an isotropic conductive adhesive film, and a nonconductive adhesive film.

14. The inductor as claimed in claim 5, further comprising an upper conductive adhesive film between the upper portions of the conductive plugs and the upper flip-chip bumps.

15. The inductor as claimed in claim 1, wherein the interlayer dielectric layer is directly on a substantially planar surface.

16. A method of manufacturing an inductor, comprising:
    forming an interlayer dielectric layer on a substrate;
    forming a first inductor device through the interlayer dielectric layer to connect to the substrate; and
    placing an RF chip having a second inductor device over the interlayer dielectric film a predetermined distance from the interlayer dielectric layer, the first and second inductor devices electrically connecting the substrate to pad areas of the RF chip, and the second inductor device covering entire exposed upper surfaces of the first inductor device penetrating the interlayer dielectric layer, and corresponding on a one-on-one basis to a respective one of the first inductor device.

17. The method as claimed in claim 16, wherein forming the first inductor device comprises:
    forming contact holes in the interlayer dielectric layer to expose the substrate; and
    filling the contact holes with conductive plugs that are the first inductor device.

18. The method as claimed in claim 17, wherein placing the RF chip comprises:
    forming upper flip-chip bumps beneath the pad areas of the RF chip;
    arranging the RF chip so that the upper flip-chip bumps correspond to the conductive plugs; and
    pressing the substrate and the RF chip at a predetermined temperature and with a predetermined pressure to bond the RF chip to the substrate.

19. The method as claimed in claim 18, wherein a distance between the contact holes and a diameter of the contact holes are determined by a distance between the pad areas of the RF chip and the size of the upper bump members.

20. The method as claimed in claim 19, wherein before the substrate and the RF chip are bonded, an upper conductive adhesive film covering the exposed surfaces of the conductive plugs is formed on the interlayer dielectric layer.

21. The method as claimed in claim 18, wherein before the interlayer dielectric layer is formed, a lower conductive adhesive film is formed.

22. The method as claimed in claim 17, wherein placing the RF chip comprises:
    forming upper bumps contacting the conductive plugs on the interlayer dielectric layer;
    arranging the RF chip so that the pad areas of the RF chip correspond to the upper bumps; and
    pressing the substrate and the RF chip at a predetermined temperature and with a predetermined pressure to bond the RF chip to the substrate.

23. The method of claim 22, wherein before the interlayer dielectric layer is formed, a lower conductive adhesive film is formed on the substrate.

24. A method of manufacturing an inductor, comprising:
    forming an interlayer dielectric layer on a substrate, the interlayer dielectric layer including a first inductor device formed in the interlayer dielectric layer;
    forming a third inductor device connecting the first inductor device to the substrate; and placing an RF chip over the interlayer dielectric layer at a predetermined distance, the RF chip including a second inductor device connecting the first inductor device to pad areas of the RF chip, and the second inductor device covering entire exposed upper surfaces of the first inductor device penetrating the interlayer dielectric layer, and corresponding on a one-on-one basis to a respective one of the first inductor devices.

25. The method as claimed in claim 24, wherein forming the interlayer dielectric layer comprises:

forming the interlayer dielectric layer on another substrate;

forming contact holes in the interlayer dielectric layer to expose the substrate;

filling the contact holes with conductive plugs that are the first inductor device; and separating the interlayer dielectric layer from the another substrate.

26. The method as claimed in claim 24, wherein the second and third inductor devices are upper and lower flip-chip bumps, respectively.

27. The method as claimed in claim 26, wherein placing the interlayer dielectric layer over the substrate comprises:

forming the upper flip-chip bumps on the substrate in consideration of a distance between the pad areas of the RF chip and the area of the pad areas;

arranging the interlayer dielectric layer so that the conductive plugs correspond to the upper flip-chip bumps; and pressing the substrate and the interlayer dielectric layer at a predetermined temperature and with a predetermined pressure to flip-chip bond the interlayer dielectric layer to the substrate.

28. The method as claimed in claim 27, wherein placing the RF chip over the interlayer dielectric layer comprises:

forming the upper flip-chip bumps beneath the pad areas of the RF chip;

arranging the RF chip so that the upper flip-chip bumps correspond to the conductive plugs; and pressing the substrate and the interlayer dielectric layer at a predetermined temperature and with a predetermined pressure to bond the interlayer dielectric layer to the substrate.

29. The method as claimed in claim 28, wherein before the interlayer dielectric layer is flip-chip bonded to the substrate, a lower conductive adhesive film is formed on the substrate.

30. The method as claimed in claim 29, wherein before the interlayer dielectric layer is flip-chip bonded to the RF chip, an upper conductive adhesive film covering the exposed surfaces of the conductive plugs is formed on the interlayer dielectric layer.

31. The method as claimed in claim 28, wherein before the interlayer dielectric layer is flip-chip bonded to the RF chip, an upper conductive adhesive film covering the exposed surfaces of the conductive plugs is formed on the interlayer dielectric layer.

* * * * *